(12) United States Patent
Chin

(10) Patent No.: US 8,541,886 B2
(45) Date of Patent: Sep. 24, 2013

(54) INTEGRATED CIRCUIT PACKAGING SYSTEM WITH VIA AND METHOD OF MANUFACTURE THEREOF

(75) Inventor: Chee Keong Chin, Hsin-Chiu Hsien (TW)

(73) Assignee: STATS ChipPAC Ltd., Singapore (SG)

(*) Notice: Subject to any disclaimer, the term of this patent is extended or adjusted under 35 U.S.C. 154(b) by 362 days.

(21) Appl. No.: 12/720,667

(22) Filed: Mar. 9, 2010

(65) Prior Publication Data
US 2011/0221072 A1 Sep. 15, 2011

(51) Int. Cl.
H01L 29/40 (2006.01)
H01L 23/02 (2006.01)
H01L 23/495 (2006.01)

(52) U.S. Cl.
USPC .............. 257/777; 257/668; 257/686

(58) Field of Classification Search
USPC .......................... 257/668, 686, 777
See application file for complete search history.

(56) References Cited

U.S. PATENT DOCUMENTS

| | | | |
|---|---|---|---|
| 4,080,026 A * | 3/1978 | Gianni | 439/69 |
| 5,545,922 A * | 8/1996 | Golwalkar et al. | 257/676 |
| 6,218,214 B1 * | 4/2001 | Panchou et al. | 438/108 |
| 6,245,595 B1 * | 6/2001 | Nguyen et al. | 438/108 |
| 6,353,263 B1 * | 3/2002 | Dotta et al. | 257/777 |
| 6,492,726 B1 * | 12/2002 | Quek et al. | 257/723 |
| 6,926,937 B2 * | 8/2005 | Extrand et al. | 428/35.7 |
| 7,059,476 B2 * | 6/2006 | Kunii et al. | 206/725 |
| 7,138,706 B2 * | 11/2006 | Arai et al. | 257/678 |
| 7,157,799 B2 | 1/2007 | Noquil et al. | |
| 7,259,450 B2 * | 8/2007 | Wood et al. | 257/685 |
| 7,310,239 B1 * | 12/2007 | Fjelstad et al. | 361/764 |
| 7,399,657 B2 * | 7/2008 | Bolken et al. | 438/106 |
| 7,588,150 B2 * | 9/2009 | Kasama | 206/710 |
| 7,642,637 B2 * | 1/2010 | Onodera et al. | 257/686 |
| 7,679,175 B2 * | 3/2010 | Saeki | 257/686 |
| 7,777,311 B2 * | 8/2010 | Utsumi et al. | 257/676 |
| 7,977,229 B2 * | 7/2011 | Ohuchi et al. | 438/598 |
| 8,106,507 B2 * | 1/2012 | Hirai | 257/726 |
| 8,247,892 B2 * | 8/2012 | Staroveck | 257/678 |
| 2001/0027933 A1 * | 10/2001 | Sasamura et al. | 206/706 |
| 2002/0042161 A1 * | 4/2002 | Sato et al. | 438/109 |
| 2004/0149623 A1 * | 8/2004 | Amador et al. | 206/710 |
| 2005/0127512 A1 * | 6/2005 | Yamagata | 257/758 |
| 2005/0269242 A1 * | 12/2005 | Crisp | 206/710 |
| 2006/0008945 A1 * | 1/2006 | Cady et al. | 438/109 |
| 2006/0063283 A1 * | 3/2006 | Cobbley et al. | 438/14 |
| 2006/0151347 A1 * | 7/2006 | Grossman | 206/440 |
| 2006/0278563 A1 * | 12/2006 | Koga | 206/707 |
| 2007/0018300 A1 * | 1/2007 | Ryu et al. | 257/686 |
| 2008/0237833 A1 * | 10/2008 | Hsu et al. | 257/691 |
| 2008/0303163 A1 | 12/2008 | Liu et al. | |
| 2009/0014843 A1 * | 1/2009 | Kawashita et al. | 257/621 |
| 2009/0194872 A1 * | 8/2009 | Wang et al. | 257/738 |
| 2009/0218560 A1 | 9/2009 | Flaim et al. | |
| 2009/0218671 A1 * | 9/2009 | Kuwabara | 257/686 |
| 2009/0236260 A1 * | 9/2009 | Lee | 206/594 |
| 2009/0283899 A1 * | 11/2009 | Yoon et al. | 257/698 |
| 2009/0321948 A1 * | 12/2009 | Wang et al. | 257/777 |

\* cited by examiner

Primary Examiner — James Mitchell
(74) Attorney, Agent, or Firm — Ishimaru & Associates LLP; I-Chang John Yang

(57) ABSTRACT

A method of manufacture of an integrated circuit packaging system includes: providing a stacking carrier having a cavity; placing a base integrated circuit in the cavity, the base integrated circuit having a base interconnect facing the cavity; mounting a stack integrated circuit to the base integrated circuit; and picking the stack integrated circuit mounted to the base integrated circuit out of the stacking carrier.

11 Claims, 5 Drawing Sheets

INTEGRATED CIRCUIT PACKAGING SYSTEM WITH VIA AND METHOD OF MANUFACTURE THEREOF

TECHNICAL FIELD

The present invention relates generally to an integrated circuit packaging system, and more particularly to a system for an integrated circuit packaging system with via.

BACKGROUND ART

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration, performance, and cost reduction.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Thus, a need still remains for an integrated circuit packaging system providing increasing density without sacrificing reliability, yield, and high volume manufacturing processes. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a stacking carrier having a cavity; placing a base integrated circuit in the cavity, the base integrated circuit having a base interconnect facing the cavity; mounting a stack integrated circuit to the base integrated circuit; and picking the stack integrated circuit mounted to the base integrated circuit out of the stacking carrier.

The present invention provides an integrated circuit packaging system, including: a base integrated circuit having a base interconnect, the base integrated circuit having a characteristic of being placed in a stacking carrier for stacking; and a stack integrated circuit mounted to the base integrated circuit.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
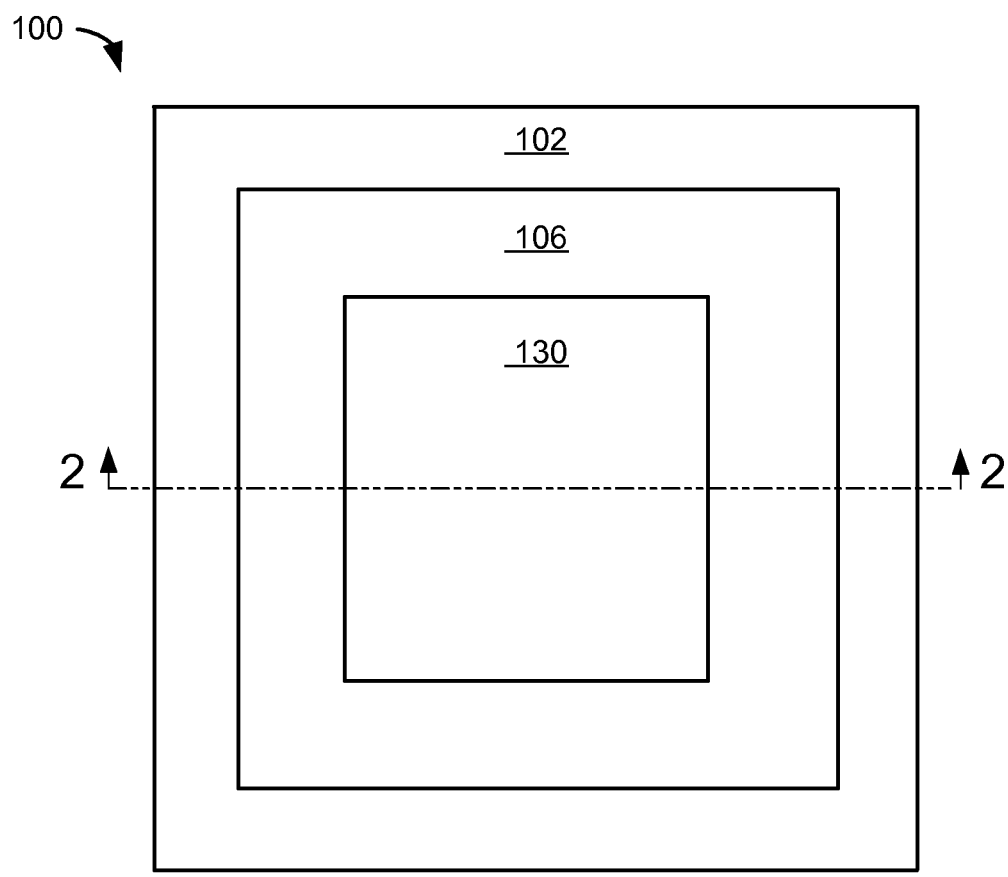
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

The term "placing" means positioning one item without forming permanent contact that is associated with creating electrical and mechanical joints commonly found in solder joints or like electrical connection joints.

Thin through silicon via (TSV) post-fabrication processing techniques are not yet proven and often have problems of wafer cracks and wafer size limitations. Back-grinding of stack dies is not practical due to potential problems of wafer cracks. Temporary bonding and de-bonding are still unproven and have many challenges for 300 mm wafers. Embodiments of the present invention provide answers or solutions to these problems.

Referring now to FIG. 1, therein is shown a top view of an integrated circuit packaging system 100 in a first embodiment of the present invention. The top view depicts a package carrier 102. The package carrier 102 is for mounting device and integrated circuits as part of the finished product to be used in a system. The package carrier 102 can be as a laminated substrate or a ceramic substrate.

In this example, a base integrated circuit 106 is shown mounted over the package carrier 102. Examples of the base integrated circuit 106 can include a through silicon via (TSV) wafer or die or thinned version of those devices, a sawn die, a device, or an interposer. Also, a stack integrated circuit 130 is shown mounted over the base integrated circuit 106 and over the package carrier 102. Examples of the stack integrated circuit 130 can include a flip chip, a passive component, or a packaged integrated circuit.

Figure 2:
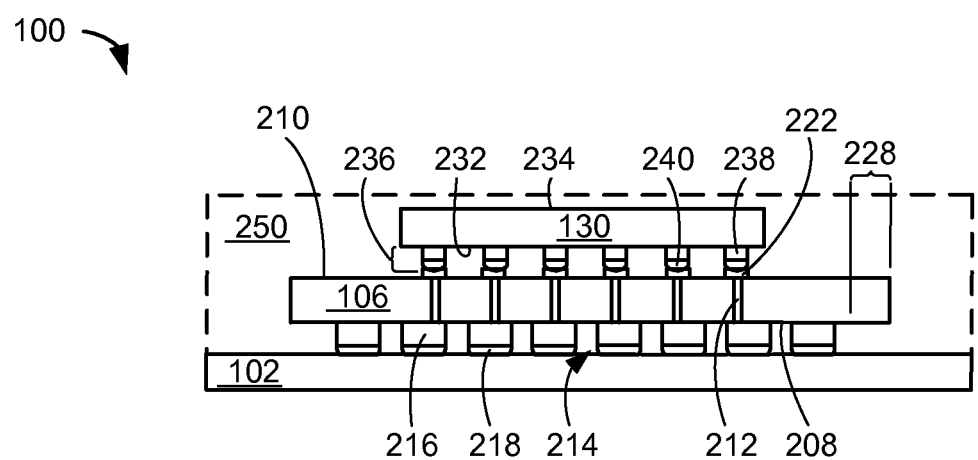
FIG. 2 is a cross-sectional view of the integrated circuit packaging system along a line 2-2 of FIG. 1.

Referring now to FIG. 2, therein is shown a cross-sectional view of the integrated circuit packaging system 100 along a line 2-2 of FIG. 1. The base integrated circuit 106 can include a base integrated circuit bottom side 208 and a base integrated circuit top side 210 opposite the base integrated circuit bottom side 208. The base integrated circuit 106 can include a through via 212, such as a TSV or a via filled with a conductive material, formed between the base integrated circuit bottom side 208 and the base integrated circuit top side 210. The through via 212 can provide electrical connectivity between the base integrated circuit bottom side 208 and the base integrated circuit top side 210.

The base integrated circuit 106 can include a base interconnect 214 for providing electrical connectivity to the package carrier 102. The base interconnect 214 can include a base pillar 216, such as a pillar bump, a post, or an electrical connector, mounted on or attached to the base integrated circuit bottom side 208. The base pillar 216 can include copper, any other metallic element, or an alloy. The base interconnect 214 can include a base cap 218 formed on the base pillar 216. The base cap 218 can include solder or any conductive material.

The base integrated circuit 106 can include a base terminal 222, such as a contact or a pad, formed on the base integrated circuit top side 210. The base terminal 222 can be formed and connected to the through via 212.

The base integrated circuit 106 can be mounted over the package carrier 102 with the base integrated circuit bottom side 208 facing the package carrier 102. A peripheral region 228 of the base integrated circuit 106 is defined as the region from the non-horizontal side of the base integrated circuit 106 and not including the region that would include the base interconnect 214.

The stack integrated circuit 130 can be mounted over the base integrated circuit 106. The stack integrated circuit 130 can include a stack integrated circuit bottom side 232 and a stack integrated circuit top side 234 opposite the stack integrated circuit bottom side 232. The stack integrated circuit bottom side 232 can have active circuitry thereon.

The stack integrated circuit 130 can include a stack interconnect 236 at the stack integrated circuit bottom side 232. The stack interconnect 236 can include a stack pillar 238, such as a pillar bump, a post, or an electrical connector, mounted on or attached to the stack integrated circuit bottom side 232. For example, the stack pillar 238 can include copper, any other metallic element, or an alloy. The stack interconnect 236 can include a stack cap 240 formed on the stack pillar 238. The stack cap 240 can include solder or any conductive material.

The stack interconnect 236 can be mounted on and connected to the base integrated circuit 106 with the stack cap 240 mounted on and connected to the base terminal 222. The base integrated circuit 106 can include characteristics of physical features from the manufacturing process as will be discussed further below.

Optionally, an encapsulation 250, as depicted by the dashed line border, can be formed over the package carrier 102 covering the base integrated circuit 106 and the stack integrated circuit 130. Examples of the encapsulation 250 can include a cover of an epoxy molding compound or a wire-in-film. The epoxy molding compound can form the encapsulation 250 through a molding process, such as injection molding. The wire-in-film can form the encapsulation 250 as an adhesive and is applied over the package carrier 102 in a B-stage and no frame or mold chase as required in the process using epoxy molding compound.

Figure 3:
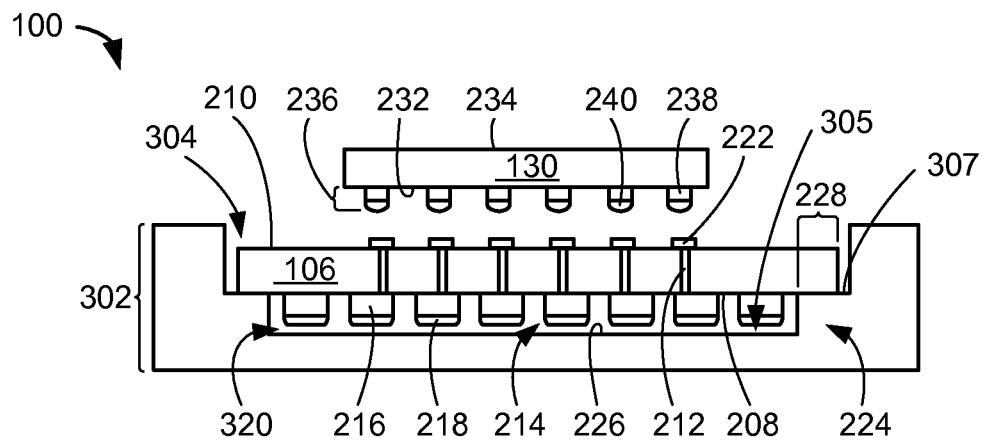
FIG. 3 is a cross-sectional view of the integrated circuit packaging system in a first example stacking phase along a section line 3-3 of FIG. 4.
Figure 4:
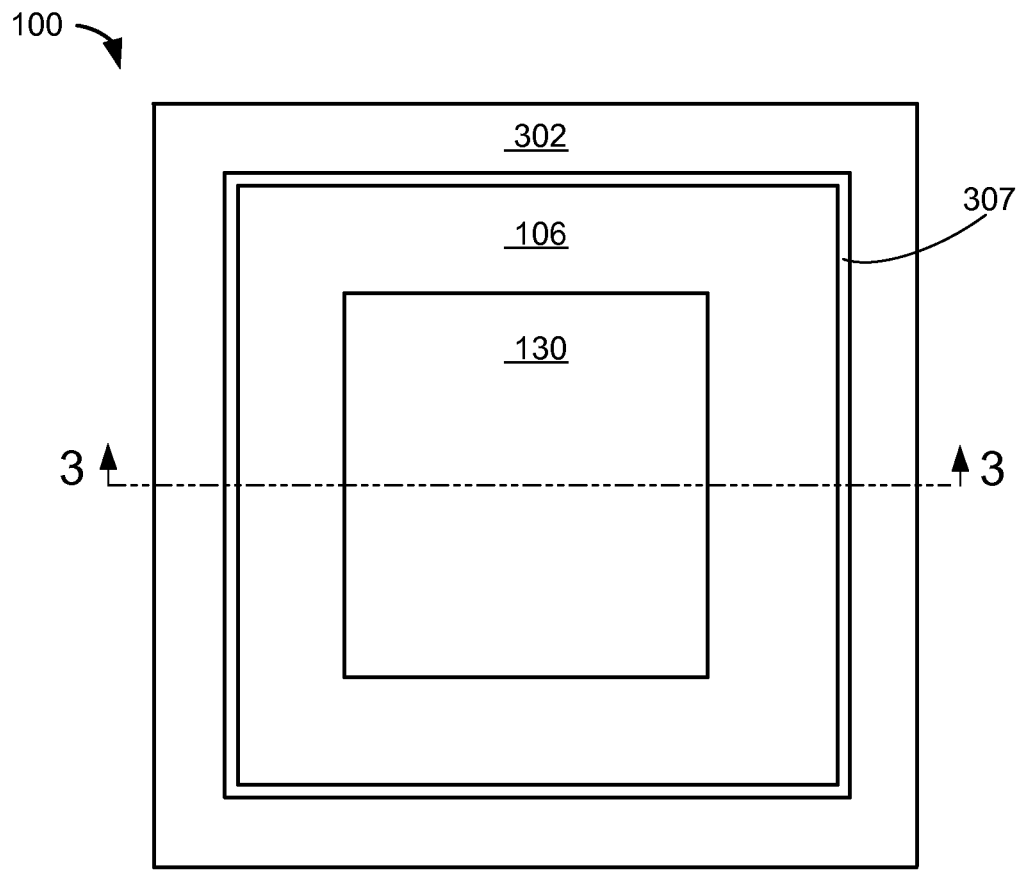
FIG. 4 is a top view of the structure of FIG. 3.

Referring now to FIG. 3, therein is shown a cross-sectional view of the integrated circuit packaging system 100 in a first example stacking phase along a section line 3-3 of FIG. 4. The first example stacking phase can represent a configuration of a packaging system, which can include processing of TSV wafers or TSV dies into the integrated circuit packaging system 100 of FIG. 1. The first example stacking phase can include changes in processing techniques and application of a new design apparatus.

The first example stacking phase can include a stacking carrier 302, such as a thermo-resist stacking carrier for temporarily supporting a device. The stacking carrier 302 can be formed with a cavity 304. The cavity 304 can include a cavity bottom 305 and a support step 307. The opening of the support step 307 is wider than an opening of the cavity bottom 305. The stacking carrier 302 can be designed or formed to support a single die or multiple dies in a matrix form, as an example.

The base integrated circuit 106 can be placed over the stacking carrier 302 in the cavity 304. As an example, the base integrated circuit 106 can be thinned and diced into small dies and sent for chip attachment. The base integrated circuit 106 can include the base integrated circuit bottom side 208 and the base integrated circuit top side 210 opposite the base integrated circuit bottom side 208.

The base integrated circuit 106 can include the through via 212 formed between the base integrated circuit bottom side 208 and the base integrated circuit top side 210. The through via 212 can provide electrical connectivity between the base integrated circuit bottom side 208 and the base integrated circuit top side 210.

The base integrated circuit 106 can include the base interconnect 214 for providing electrical connectivity to external systems (not shown). The base interconnect 214 can include the base pillar 216 formed on or attached to the base integrated circuit bottom side 208. The base interconnect 214 can include the base cap 218 formed on the base pillar 216.

The base integrated circuit 106 can include the base terminal 222 formed on the base integrated circuit top side 210. The base terminal 222 can be formed and connected to the through via 212.

The base integrated circuit 106 can be placed with pick-and-place assembly techniques. The base integrated circuit 106 can be placed and mounted over the stacking carrier 302 with the base integrated circuit bottom side 208 facing the stacking carrier 302. The peripheral region 228 of the base integrated circuit 106 can be placed on the support step 307 such that a gap 320 is between the stacking carrier 302 at the cavity bottom 305 and the base cap 218.

The support step 307 can provide protection for the base interconnect 214, preventing the base interconnect 214 from being damaged. The base interconnect 214 can be adjacent or surrounded by the support step 307 and within the cavity bottom 305.

The stacking carrier 302 and the support step 307 can reduce overall assembly cost by eliminating temporary bonding processes. The assembly processes can be done at outsourced semiconductor assembly and test (OSAT) service providers and not dominated by current wafer fabrication (fab) lines, which require temporary bonding.

The stack integrated circuit 130 can be placed over the base integrated circuit 106. The stack integrated circuit 130 can include the stack integrated circuit bottom side 232 and the stack integrated circuit top side 234 opposite the stack integrated circuit bottom side 232.

The stack integrated circuit 130 can include the stack interconnect 236. The stack interconnect 236 can include the stack pillar 238 formed on or attached to the stack integrated circuit bottom side 232. The stack interconnect 236 can include the stack cap 240 formed on the stack pillar 238.

The stack interconnect 236 can be mounted on or placed on the base integrated circuit 106 with the stack cap 240 on the base terminal 222. For illustrative purposes, the cross-sectional view is shown with the integrated circuit packaging system 100 in an assembly process of a mounting phase of the stack integrated circuit 130 over the base integrated circuit 106.

Reflow occurs after the stack of the stack integrated circuit 130 and the base integrated circuit 106 has been removed from the stacking carrier 302 by a pick-and-place process and placed on the package carrier 102 of FIG. 1, as an example. The reflow can form joints between the base integrated circuit 106 and the stack integrated circuit 130.

The base integrated circuit 106 can include characteristics of being on the support step 307. The characteristics can include physical features, such as dents, impression marks, pressure marks, or residuals, on the peripheral region 228 of the base integrated circuit 106. For example, a passivation layer (not shown) at the base integrated circuit bottom side 208 may have a ring impression at the peripheral region 228 left by the supporting force by the support step 307.

It has been discovered that a new apparatus design of the stacking carrier 302 having the cavity 304 eliminates deformation of the base interconnect 214. The base integrated circuit 106 and a plurality of the stack integrated circuit 130 can be processed into final products without temporary bonding and de-bonding between the stacking carrier 302 and the base integrated circuit 106, thereby eliminating any deformation that would be caused by bonding and debonding process.

It has also been discovered that the stacking carrier 302 and a support layer 224 provide process improvements. The process improvements include enabling 'outsourced semiconductor assembly and test' (OSAT) service providers or back-end assembly providers to assemble the base integrated circuit 106 and the stack integrated circuit 130.

It has further been discovered that the stacking carrier 302 and the support layer 224 significantly reduce assembly cost. The assembly cost reduction includes no additional investment is needed for temporary bonders or reduction in assembly time thereby resulting in low manufacturing cost or process simplification.

It has further been discovered that the stacking carrier 302 and the support layer 224 provide manufacturing improvements to increase yield. The manufacturing improvements include eliminating wafer cracks encountered in back-grinding multi-die or stacked devices such as the stack integrated circuit 130 over the base integrated circuit 106, or providing good warpage performance compared to conventional die-to-substrate approaches.

Referring now to FIG. 4, therein is shown a top view of the structure of FIG. 3. The top view depicts the base integrated circuit 106 mounted over the stacking carrier 302. The base integrated circuit 106 can be mounted over or on the support step 307. The stack integrated circuit 130 can be mounted over the base integrated circuit 106.

Figure 5:
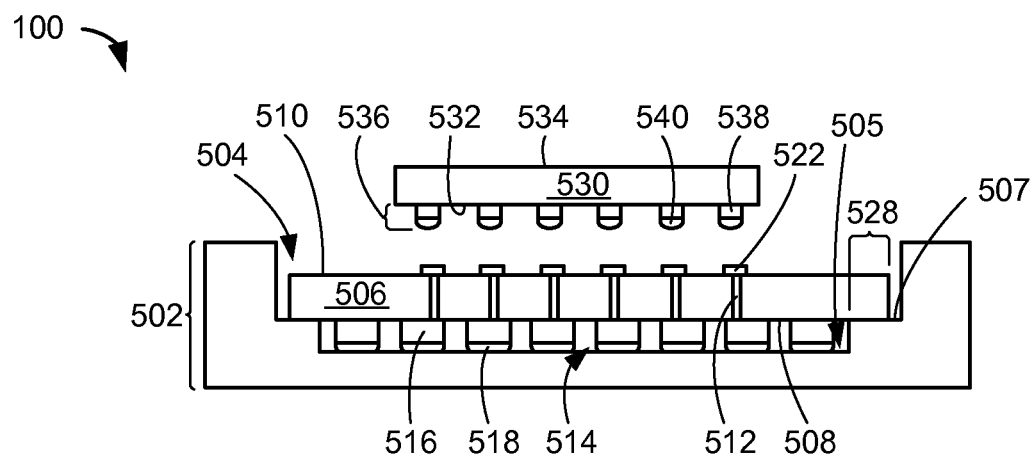
FIG. 5 is a cross-sectional view similar to FIG. 3 of the integrated circuit packaging system of FIG. 1 in a second example stacking phase.

Referring now to FIG. 5, therein is shown a cross-sectional view similar to FIG. 3 of the integrated circuit packaging system 100 of FIG. 1 in a second example stacking phase. The second example stacking phase can represent a configuration of a packaging system, which is similar to the first example in FIG. 4, for stacking the integrated circuit packaging system 100 of FIG. 1. The second example stacking phase can include changes in processing techniques and application of a new design apparatus.

For clarity, the base integrated circuit 106 of FIG. 2 is described as a base integrated circuit 506 in FIG. 5. This allows for possible physical characteristics that can result for the differences in the stacking processes used, as described in more detail below. The base integrated circuit 506 has structural similarities to the base integrated circuit 106 unless expressly described differently below.

Also for clarity, the stack integrated circuit 130 of FIG. 2 is described as a stack integrated circuit 530. The stack integrated circuit 530 has structural similarities to the stack integrated circuit 130 unless expressly described differently below.

The second example stacking phase can include a stacking carrier 502, such as a thermo-resist stacking carrier for temporarily supporting a device. The stacking carrier 502 can be formed with a cavity 504. The cavity 504 can include a cavity bottom 505 and a support step 507. The opening of the support step 507 is wider than an opening of the cavity bottom 505. The stacking carrier 502 can be designed or formed to support a single die or multiple dies in a matrix form, as an example.

The base integrated circuit 506 can be placed over the stacking carrier 502 in the cavity 504. As an example, the base integrated circuit 506 can be thinned and diced into small dies and sent for chip attachment. The base integrated circuit 506 can include a base integrated circuit bottom side 508 and a base integrated circuit top side 510 opposite the base integrated circuit bottom side 508.

The base integrated circuit 506 can include a through via 512 formed between the base integrated circuit bottom side 508 and the base integrated circuit top side 510. The through via 512 can provide electrical connectivity between the base integrated circuit bottom side 508 and the base integrated circuit top side 510.

The base integrated circuit 506 can include a base interconnect 514 for providing electrical connectivity to the package carrier 102 of FIG. 2. The base interconnect 514 can include a base pillar 516 formed on or attached to the base integrated circuit bottom side 508. The base interconnect 514 can include a base cap 518 formed on the base pillar 516.

The base integrated circuit 506 can include a base terminal 522 formed on the base integrated circuit top side 510. The base terminal 522 can be formed and connected to the through via 512.

The base integrated circuit 506 can be placed with pick-and-place assembly techniques. The base integrated circuit 506 can be placed over the stacking carrier 502 with the base integrated circuit bottom side 508 facing the stacking carrier 502. A peripheral region 528 of the base integrated circuit 506 can be placed on the support step 507 such that the base cap 518 contacts the stacking carrier 502 at the cavity bottom 505. The contact of the base cap 518 with the cavity bottom 505 allows additional support for preventing warpage the base integrated circuit 506. The base interconnect 514 can be adjacent or surrounded by the support step 507 and within the cavity bottom 505.

The stack integrated circuit 530 can be mounted over the base integrated circuit 506. The stack integrated circuit 530 can include a stack integrated circuit bottom side 532 and a stack integrated circuit top side 534 opposite the stack integrated circuit bottom side 532. The stack integrated circuit bottom side 532 can have active circuitry thereon.

The stack integrated circuit 530 can include a stack interconnect 536. The stack interconnect 536 can include a stack pillar 538 formed on or attached to the stack integrated circuit bottom side 532. The stack interconnect 536 can include a stack cap 540 formed on the stack pillar 538.

The stack interconnect 536 can be mounted on and connected to the base integrated circuit 506 with the stack cap 540 mounted on and connected to the base terminal 522. For illustrative purposes, the cross-sectional view is shown with the integrated circuit packaging system 100 in an assembly process of a mounting phase of the stack integrated circuit 530.

Reflow occurs after the stack of the stack integrated circuit 530 and the base integrated circuit 506 has been removed from the stacking carrier 502 by a pick-and-place process and placed on the package carrier 102 of FIG. 1, as an example. The reflow can form joints between the base integrated circuit 506 and the stack integrated circuit 530.

The base integrated circuit 506 can include characteristics of being on the support step 507. The characteristics can include physical features, such as dents, impression marks, pressure marks, or residuals, on the peripheral region 528 of the base integrated circuit 506. For example, a passivation layer (not shown) at the base integrated circuit bottom side 508 may have a ring impression at the peripheral region 528 left by the supporting force by the support step 507. The physical features on the peripheral region 528 is not as deep or pronounced as those formed in the process described in FIG. 3 because the base interconnect 514 contacts the cavity bottom 505 thereby reducing the stacking force to the peripheral region 528.

It has been discovered that the present invention provides the integrated circuit packaging system 100 for improved yield and increased reliability. The profile of the cavity 504 of the stacking carrier 502 allows the base cap 518 to contact the cavity bottom 505 providing support to the base integrated circuit 506. This prevents warpage in portions of the base integrated circuit 506 over the base interconnect 514 reducing or eliminating damage to the base integrated circuit 506 thereby increasing reliability and improving yield.

Figure 6:
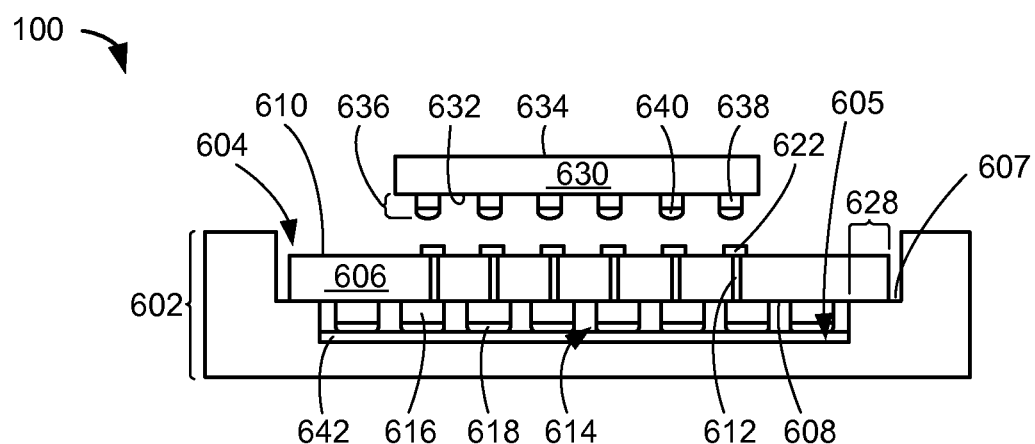
FIG. 6 is a cross-sectional view similar to FIG. 3 of the integrated circuit packaging system of FIG. 1 in a third example stacking phase.

Referring now to FIG. 6, therein is shown a cross-sectional view similar to FIG. 3 of the integrated circuit packaging system 100 of FIG. 1 in a third example stacking phase. The third example stacking phase can represent a configuration of a packaging system, which is similar to the first example in FIG. 4, for stacking the integrated circuit packaging system 100 of FIG. 1. The third example stacking phase can include changes in processing techniques and application of a new design apparatus.

For clarity, the base integrated circuit 106 of FIG. 2 is described as a base integrated circuit 606 in FIG. 6. This allows for possible physical characteristics that can result for the differences in the stacking processes used, as described in more detail below. The base integrated circuit 606 has structural similarities to the base integrated circuit 106 unless expressly described differently below.

Also for clarity, the stack integrated circuit 130 of FIG. 2 is described as a stack integrated circuit 630. The stack integrated circuit 630 has structural similarities to the stack integrated circuit 130 unless expressly described differently below.

The third example stacking phase can include a stacking carrier 602, such as a thermo-resist stacking carrier for temporarily supporting a device. The stacking carrier 602 can be formed with a cavity 604. The cavity 604 can include a cavity bottom 605 and a support step 607. The opening of the support step 607 is wider than an opening of the cavity bottom 605. The stacking carrier 602 can be designed or formed to support a single die or multiple dies in a matrix form, as an example. The stacking carrier 602 can include a compliant layer 642, such as a dispensing polymer, epoxy, tape, or the buffer layer, within the cavity bottom 605.

The base integrated circuit 606 can be placed over the stacking carrier 602 in the cavity 604. As an example, the base integrated circuit 606 can be thinned and diced into small dies and sent for chip attachment. The base integrated circuit 606 can include a base integrated circuit bottom side 608 and a base integrated circuit top side 610 opposite the base integrated circuit bottom side 608.

The base integrated circuit 606 can include a through via 612 formed between the base integrated circuit bottom side 608 and the base integrated circuit top side 610. The through via 612 can provide electrical connectivity between the base integrated circuit bottom side 608 and the base integrated circuit top side 610.

The base integrated circuit 606 can include a base interconnect 614 for providing electrical connectivity to the package carrier 102 of FIG. 2. The base interconnect 614 can include a base pillar 616 formed on or attached to the base integrated circuit bottom side 608. The base interconnect 614 can include a base cap 618 formed on the base pillar 616.

The base integrated circuit 606 can include a base terminal 622 formed on the base integrated circuit top side 610. The base terminal 622 can be formed and connected to the through via 612.

The base integrated circuit 606 can be placed with pick-and-place assembly techniques. The base integrated circuit 606 can be placed over the stacking carrier 602 with the base integrated circuit bottom side 608 facing the stacking carrier 602. A peripheral region 628 of the base integrated circuit 606 can be placed on the support step 607 such that the base cap 618 contacts the compliant layer 642 at the cavity bottom 605.

The contact of the base cap 618 with the compliant layer 642 protects the base cap 618 from damage and allows additional support for preventing warpage the base integrated circuit 606. The base interconnect 614 can be adjacent or surrounded by the support step 607 and within the cavity bottom 605.

The stack integrated circuit 630 can be mounted over the base integrated circuit 606. The stack integrated circuit 630 can include a stack integrated circuit bottom side 632 and a stack integrated circuit top side 634 opposite the stack integrated circuit bottom side 632. The stack integrated circuit bottom side 632 can have active circuitry thereon.

The stack integrated circuit 630 can include a stack interconnect 636. The stack interconnect 636 can include a stack pillar 638 formed on or attached to the stack integrated circuit bottom side 632. The stack interconnect 636 can include a stack cap 640 formed on the stack pillar 638.

The stack interconnect 636 can be mounted on and connected to the base integrated circuit 606 with the stack cap 640 mounted on and connected to the base terminal 622. For illustrative purposes, the cross-sectional view is shown with the integrated circuit packaging system 100 in an assembly process of a mounting phase of the stack integrated circuit 630.

Reflow occurs after the stack of the stack integrated circuit 630 and the base integrated circuit 606 has been removed from the stacking carrier 602 by a pick-and-place process and placed on the package carrier 102 of FIG. 1, as an example. The reflow can form joints between the base integrated circuit 606 and the stack integrated circuit 630.

The base integrated circuit 606 can include characteristics of being on the support step 607. The characteristics can include physical features, such as dents, impression marks, pressure marks, or residuals, on the peripheral region 628 of the base integrated circuit 606. For example, a passivation layer (not shown) at the base integrated circuit bottom side 608 may have a ring impression at the peripheral region 628 left by the supporting force by the support step 607. The physical features on the peripheral region 628 is not as deep or pronounced as those formed in the process described in FIG. 3 because the base interconnect 614 contacts the cavity bottom 605 thereby reducing the stacking force to the peripheral region 628. The characteristics of the compliant layer 642 removed from the base interconnect 614 can leave residuals, such adhesive, or tacky residue, on the base interconnect 614.

It has been discovered that the present invention provides the integrated circuit packaging system 100 for improved yield and increased reliability. The profile of the cavity 604 of the stacking carrier 602 allows the base cap 618 to contact the compliant layer 642 at the cavity bottom 605 providing support to the base integrated circuit 606. This prevents warpage in portions of the base integrated circuit 606 over the base interconnect 614 reducing or eliminating damage to the base integrated circuit 606 thereby increasing reliability and improved yield. Also, the compliant layer 642 reduces or eliminates damage to the base cap 618 to further increase reliability and improve yield.

Figure 7:
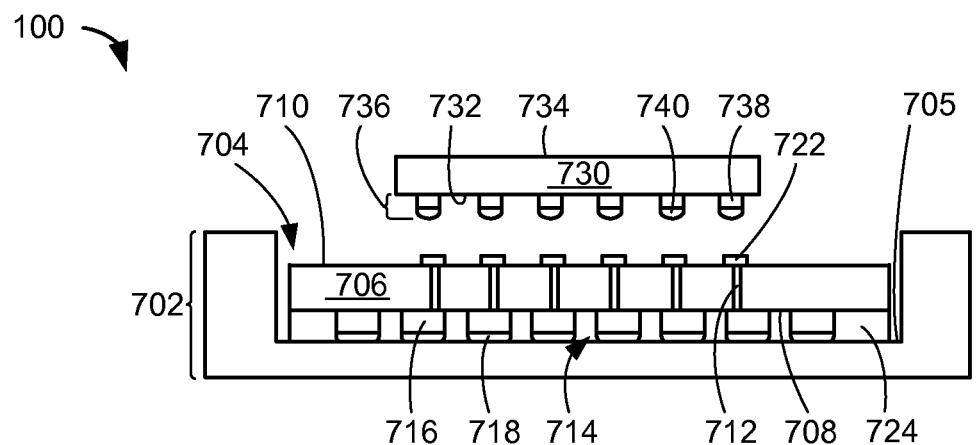
FIG. 7 is a cross-sectional view similar to FIG. 3 of the integrated circuit packaging system of FIG. 1 in a fourth example stacking phase.

Referring now to FIG. 7, therein is shown a cross-sectional view similar to FIG. 3 of the integrated circuit packaging system 100 of FIG. 1 in a fourth example stacking phase. The fourth example stacking phase can represent a configuration of a packaging system, which is similar to the first example in FIG. 4, for stacking the integrated circuit packaging system 100 of FIG. 1. The fourth example stacking phase can include changes in processing techniques and application of a new design apparatus.

For clarity, the base integrated circuit 106 of FIG. 2 is described as a base integrated circuit 706 in FIG. 7. This allows for possible physical characteristics that can result for the differences in the stacking processes used, as described in more detail below. The base integrated circuit 706 has structural similarities to the base integrated circuit 106 unless expressly described differently below.

Also for clarity, the stack integrated circuit 130 of FIG. 2 is described as a stack integrated circuit 730. The stack integrated circuit 730 has structural similarities to the stack integrated circuit 130 unless expressly described differently below.

The fourth example stacking phase can include a stacking carrier 702. The stacking carrier 702 can be formed with a cavity 704. The cavity 704 can include a cavity bottom 705.

The base integrated circuit 706 can be placed over the stacking carrier 702 in the cavity 704. As an example, the base integrated circuit 706 can be thinned and diced into small dies and sent for chip attachment. The base integrated circuit 706 can include a base integrated circuit bottom side 708 and a base integrated circuit top side 710 opposite the base integrated circuit bottom side 708.

The base integrated circuit 706 can include a through via 712 formed between the base integrated circuit bottom side 708 and the base integrated circuit top side 710. The through via 712 can provide electrical connectivity between the base integrated circuit bottom side 708 and the base integrated circuit top side 710.

The base integrated circuit 706 can include a base interconnect 714 for providing electrical connectivity to the package carrier 102 of FIG. 2. The base interconnect 714 can include a base pillar 716 formed on or attached to the base integrated circuit bottom side 708. The base interconnect 714 can include a base cap 718 formed on the base pillar 716.

The base integrated circuit 706 can include a base terminal 722 formed on the base integrated circuit top side 710. The base terminal 722 can be formed and connected to the through via 712.

A protection layer 724 can be pre-applied or pre-formed to the base integrated circuit bottom side 708 of the base integrated circuit 706. A protection layer 824 provides protection to the base interconnect 714 including the base cap 718. The protection layer 724 can be conformal to the base interconnect 714 and the base integrated circuit bottom side 708. As an example, the protection layer 824 can be a pre-applied non-flow underfill material.

The base integrated circuit 706 can be placed with pick-and-place assembly techniques. The base integrated circuit 706 can be placed over the stacking carrier 702 and within the cavity 704 with the base integrated circuit bottom side 708 facing the stacking carrier 702. The base cap 718, the protection layer 724, or a combination thereof can contact the cavity bottom 705. The contact of the base cap 718, the protection layer 724, or a combination thereof can support the base integrated circuit 706 preventing warpage.

The stack integrated circuit 730 can be mounted over the base integrated circuit 706. The stack integrated circuit 730 can include a stack integrated circuit bottom side 732 and a stack integrated circuit top side 734 opposite the stack integrated circuit bottom side 732. The stack integrated circuit bottom side 732 can have active circuitry thereon.

The stack integrated circuit 730 can include a stack interconnect 736. The stack interconnect 736 can include a stack pillar 738 formed on or attached to the stack integrated circuit bottom side 732. The stack interconnect 736 can include a stack cap 740 formed on the stack pillar 738.

The stack interconnect 736 can be mounted on and connected to the base integrated circuit 706 with the stack cap 740 mounted on and connected to the base terminal 722. For illustrative purposes, the cross-sectional view is shown with the integrated circuit packaging system 100 in an assembly process of a mounting phase of the stack integrated circuit 730.

Reflow occurs after the stack of the stack integrated circuit 730 and the base integrated circuit 706 has been removed from the stacking carrier 702 by a pick-and-place process and placed on the package carrier 102 of FIG. 1, as an example. The reflow can form joints between the base integrated circuit 706 and the stack integrated circuit 730.

It has been discovered that the present invention provides the integrated circuit packaging system 100 for improved yield and increased reliability. The protection layer 724 protects the base integrated circuit 706 by mitigating warpage because the protection layer 724 can provide planar support to the base integrated circuit 706. The protection layer 724 also protect the base interconnect 714 during the stacking process and attachment to the package carrier 102. Both types of protection not only increases the reliability of the base integrated circuit 706 and to the system attached thereto but also increases yield to both as well.

Figure 8:
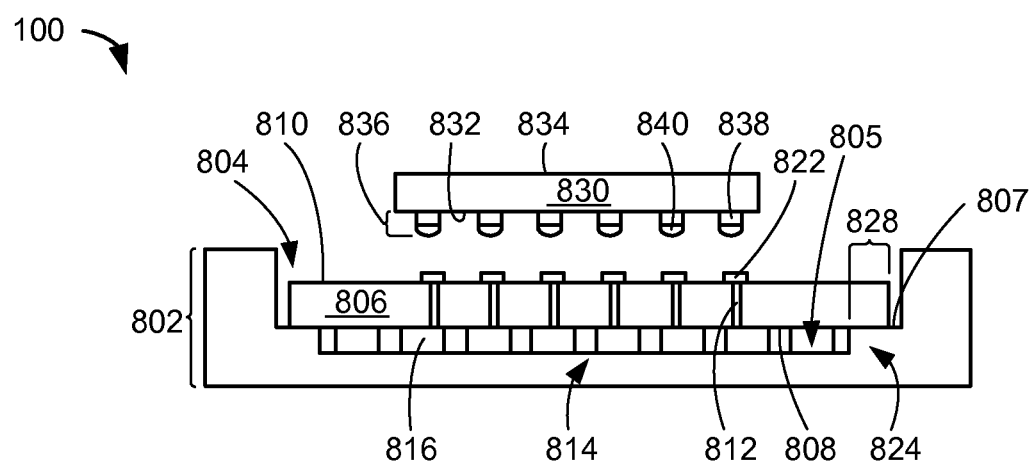
FIG. 8 is a cross-sectional view similar to FIG. 3 of the integrated circuit packaging system of FIG. 1 in a fifth example stacking phase.

Referring now to FIG. 8, therein is shown a cross-sectional view similar to FIG. 3 of the integrated circuit packaging system 100 of FIG. 1 in a fifth example stacking phase. The fifth example stacking phase can represent a configuration of a packaging system, which is similar to the first example in FIG. 4, for stacking the integrated circuit packaging system 100 of FIG. 1. The fifth example stacking phase can include changes in processing techniques and application of a new design apparatus.

For clarity, the base integrated circuit 106 of FIG. 2 is described as a base integrated circuit 806 in FIG. 8. This allows for possible physical characteristics that can result for the differences in the stacking processes used, as described in more detail below. The base integrated circuit 806 has structural similarities to the base integrated circuit 106 unless expressly described differently below.

Also for clarity, the stack integrated circuit 130 of FIG. 2 is described as a stack integrated circuit 830. The stack integrated circuit 830 has structural similarities to the stack integrated circuit 130 unless expressly described differently below.

The fifth example stacking phase can include a stacking carrier 802. The stacking carrier 802 can be formed with a cavity 804. The cavity 804 can include a cavity bottom 805 and a support step 807. The opening of the support step 807 is wider than an opening of the cavity bottom 805. The stacking carrier 802 can be designed or formed to support a single die or multiple dies in a matrix form, as an example.

The base integrated circuit 806 can be placed over the stacking carrier 802 in the cavity 804. As an example, the base integrated circuit 806 can be thinned and diced into small dies and sent for chip attachment. The base integrated circuit 806 can include a base integrated circuit bottom side 808 and a base integrated circuit top side 810 opposite the base integrated circuit bottom side 808.

The base integrated circuit 806 can include a through via 812 formed between the base integrated circuit bottom side 808 and the base integrated circuit top side 810. The through via 812 can provide electrical connectivity between the base integrated circuit bottom side 808 and the base integrated circuit top side 810.

The base integrated circuit 806 can include a base interconnect 814 for providing electrical connectivity to the package carrier 102 of FIG. 2. The base interconnect 814 can include a base pillar 816 formed on or attached to the base integrated circuit bottom side 808.

The base integrated circuit 806 can include a base terminal 822 formed on the base integrated circuit top side 810. The base terminal 822 can be formed and connected to the through via 812.

The base integrated circuit 806 can be placed with pick-and-place assembly techniques. The base integrated circuit 806 can be placed over the stacking carrier 802 with the base integrated circuit bottom side 808 facing the stacking carrier 802. A peripheral region 828 of the base integrated circuit 806 can be placed on the support step 807 such that the base pillar 816 contacts the stacking carrier 802 at the cavity bottom 805.

The contact of the base pillar 816 with the cavity bottom 805 allows additional support for preventing warpage the base integrated circuit 806. This option prevents the base cap 218 of FIG. 2 from being deformed. The base cap 218 can be applied subsequent to the fifth example stacking phase. The base interconnect 814 can be adjacent or surrounded by the support step 807 and within the cavity bottom 805.

The stack integrated circuit 830 can be mounted over the base integrated circuit 806. The stack integrated circuit 830 can include a stack integrated circuit bottom side 832 and a stack integrated circuit top side 834 opposite the stack integrated circuit bottom side 832. The stack integrated circuit bottom side 832 can have active circuitry thereon.

The stack integrated circuit 830 can include a stack interconnect 836. The stack interconnect 836 can include a stack pillar 838 formed on or attached to the stack integrated circuit bottom side 832. The stack interconnect 836 can include a stack cap 840 formed on the stack pillar 838.

The stack interconnect 836 can be mounted on and connected to the base integrated circuit 806 with the stack cap 840 mounted on and connected to the base terminal 822. For illustrative purposes, the cross-sectional view is shown with the integrated circuit packaging system 100 in an assembly process of a mounting phase of the stack integrated circuit 830.

Reflow occurs after the stack of the stack integrated circuit 830 and the base integrated circuit 806 has been removed from the stacking carrier 802 by a pick-and-place process and placed on the package carrier 102 of FIG. 1, as an example. The reflow can form joints between the base integrated circuit 806 and the stack integrated circuit 830.

The base integrated circuit 806 can include characteristics of being on the support step 807. The characteristics can include physical features, such as dents, impression marks, pressure marks, or residuals, on the peripheral region 828 of the base integrated circuit 806. For example, a passivation layer (not shown) at the base integrated circuit bottom side 808 may have a ring impression at the peripheral region 828 left by the supporting force by the support step 807. The base pillar 816 can have some chipping or dents from the contact to the cavity bottom 805.

It has been discovered that the present invention provides an integrated circuit packaging system 800 for improved yield and increased reliability. The profile of the cavity 804 of the stacking carrier 802 allows the base pillar 816 to contact the cavity bottom 805 providing support to the base integrated circuit 806. This prevents warpage in portions of the base integrated circuit 806 over the base interconnect 814 reducing or eliminating damage to the base integrated circuit 806 thereby increasing reliability and improved yield.

Figure 9:
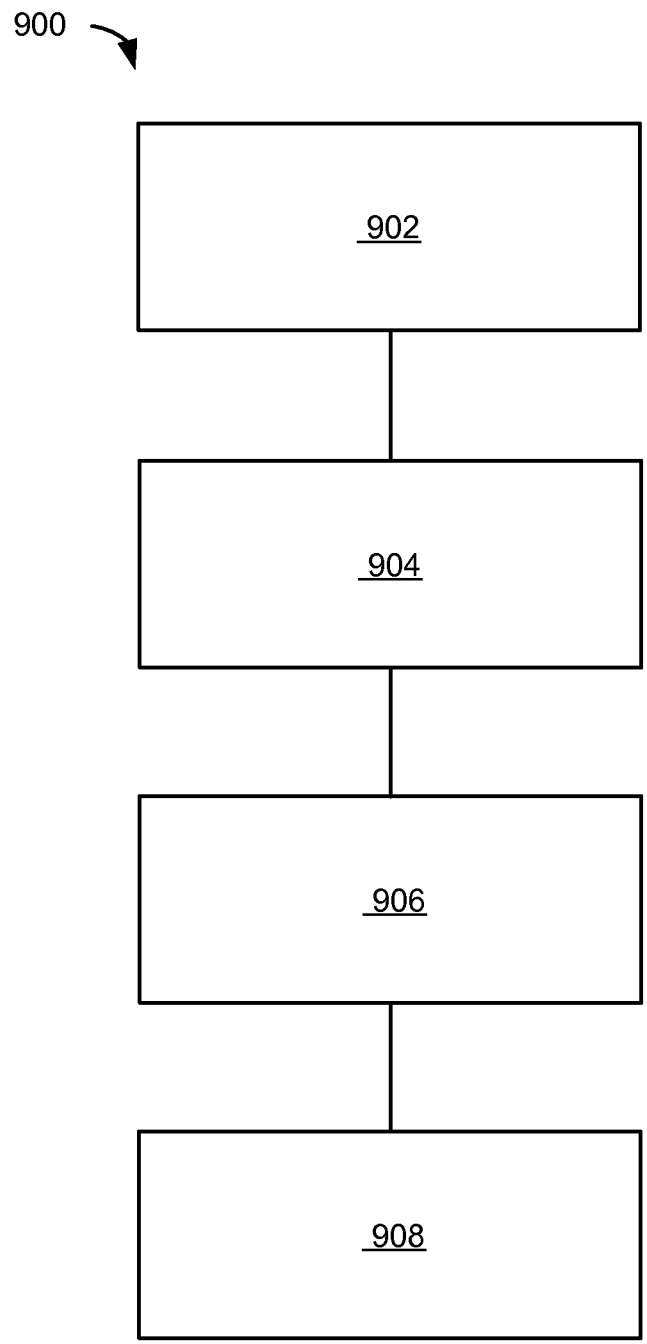
FIG. 9 is a flow chart of a method of manufacture of an integrated circuit packaging system in a further embodiment of the present invention.

Referring now to FIG. 9, therein is shown a flow chart of a method 900 of manufacture of the integrated circuit packaging system in a further embodiment of the present invention. The method 900 includes: providing a stacking carrier having a cavity in a block 902; placing a base integrated circuit in the cavity, the base integrated circuit having a base interconnect facing the cavity in a block 904; mounting a stack integrated circuit to the base integrated circuit in a block 906; and picking the stack integrated circuit mounted to the base integrated circuit out of the stacking carrier in a block 908.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a stacking carrier having a cavity and a support step in the cavity, wherein providing the stacking carrier includes providing the stacking carrier having a compliant layer in the cavity;
   placing a base integrated circuit in the cavity, the base integrated circuit having a peripheral region and a base interconnect facing the cavity, the peripheral region on the support step, wherein placing the base integrated circuit in the cavity includes placing the base interconnect on the compliant layer;
   mounting a stack integrated circuit to the base integrated circuit; and
   picking the stack integrated circuit mounted to the base integrated circuit out of the stacking carrier wherein the base integrated circuit comprises the peripheral region having an impression mark characteristic of the base integrated circuit being placed on the support step.

2. The method as claimed in claim 1 wherein:
   providing the stacking carrier includes providing the stacking carrier having a cavity bottom below the support step; and
   placing the base integrated circuit in the cavity includes placing the base interconnect on the cavity bottom.

3. The method as claimed in claim 1 wherein placing the base integrated circuit in the cavity includes:
   providing the base integrated circuit having a protection layer surrounding the base interconnect; and
   placing the protection layer in contact with a cavity bottom of the cavity.

4. A method of manufacture of an integrated circuit packaging system comprising:
   providing a stacking carrier having a cavity, a cavity bottom, and a support step in the cavity, the cavity bottom below the support step, wherein providing the stacking carrier includes providing the stacking carrier having a compliant layer on the cavity bottom;
   placing a base integrated circuit in the cavity, the base integrated circuit having a peripheral region, a gap, a base interconnect, and a through via with the base interconnect facing the cavity, the peripheral region on the support step, and the gap between the base interconnect and the cavity bottom, wherein placing the base integrated circuit in the cavity includes placing the base interconnect on the compliant layer;
   mounting a stack integrated circuit to the base integrated circuit, the stack integrated circuit connected to the through via; and
   picking the stack integrated circuit mounted to the base integrated circuit out of the stacking carrier wherein the base integrated circuit comprises the peripheral region having an impression mark characteristic of the base integrated circuit being placed on the support step.

5. The method as claimed in claim 4 wherein placing the base integrated circuit in the cavity includes placing the base integrated circuit in contact with the stacking carrier.

6. The method as claimed in claim 4 further comprising mounting the stack integrated circuit mounted to the base integrated circuit to a package carrier.

7. An integrated circuit packaging system comprising:
   a base integrated circuit having a peripheral region and a base interconnect, the peripheral region having an impression mark characteristic of the base integrated circuit being placed on a support step in a cavity of a stacking carrier, wherein the base integrated circuit includes the base interconnect comprises the peripheral region having an impression mark characteristic of the base integrated circuit being placed on the support step, and having a tacky residue characteristic of a compliant layer of the stacking carrier removed from the base interconnect; and
   a stack integrated circuit mounted to the base integrated circuit, wherein the base base integrated circuit includes a through via, and wherein the stack integrated circuit is connected to the through via.

8. The system as claimed in claim 7 wherein the base integrated circuit having the base interconnect includes a protection layer surrounding the base interconnect.

9. The system as claimed in claim 7 wherein:
   the base integrated circuit includes a base terminal on the through via; and
   wherein the stack integrated circuit is on the base terminal.

10. The system as claimed in claim 9 further comprising:
    an encapsulation covering the base integrated circuit and the stack integrated circuit.

11. The system as claimed in claim 7 further comprising:
    a package carrier; and
    wherein:

the stack integrated circuit mounted to the base integrated circuit is over the package carrier.

* * * * *